United States Patent
Hwang

(10) Patent No.: US 9,252,253 B2
(45) Date of Patent: Feb. 2, 2016

(54) HIGH ELECTRON MOBILITY TRANSISTOR

(71) Applicant: Samsung Electronics Co., Ltd., Suwon-Si, Gyeonggi-Do (KR)

(72) Inventor: In-jun Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/330,072

(22) Filed: Jul. 14, 2014

(65) Prior Publication Data

US 2015/0108547 A1    Apr. 23, 2015

(30) Foreign Application Priority Data

Oct. 17, 2013    (KR) .......................... 10-2013-0124169

(51) Int. Cl.
*H01L 29/66*    (2006.01)
*H01L 29/778*    (2006.01)
(Continued)

(52) U.S. Cl.
CPC .......... *H01L 29/778* (2013.01); *H01L 29/2003* (2013.01); *H01L 29/402* (2013.01); *H01L 29/41725* (2013.01); *H01L 29/42316* (2013.01);
(Continued)

(58) Field of Classification Search
CPC . H01L 29/06; H01L 29/0603; H01L 29/0607; H01L 29/0611; H01L 29/0615; H01L 29/0619; H01L 29/778; H01L 29/7781; H01L 29/7782; H01L 29/7783; H01L 29/7784; H01L 29/7785; H01L 29/7786; H01L 29/7787; H01L 29/7788; H01L 29/7789; H01L 29/41425; H01L 29/41725; H01L 29/402; H01L 29/42316; H01L 29/66462; H01L 29/2003; H01L 29/41
See application file for complete search history.

(56) References Cited

U.S. PATENT DOCUMENTS 5,250,822 A * 10/1993 Sonoda et al. ................ 257/194
6,429,471 B1 * 8/2002 Yokoyama et al. ........... 257/289
(Continued)

FOREIGN PATENT DOCUMENTS

JP    2008124374 A    5/2008
JP    2011-066464 A    3/2011
(Continued)

OTHER PUBLICATIONS

Machine tranlation, Choi, Korean Patent Publication No. KR 10-200-0034921 (translation date: Apr. 2, 2015), KIPO, all pages.*
(Continued)

*Primary Examiner* — Fernando Toledo
*Assistant Examiner* — Victoria K Hall
(74) *Attorney, Agent, or Firm* — Harness, Dickey & Pierce, P.L.C.

(57) ABSTRACT

According to example embodiments, a high electron mobility transistor (HEMT) includes a channel layer having a 2-dimensional electron gas (2DEG), a channel supply layer on the channel layer, a source electrode and a drain electrode spaced apart from each other on one of the channel layer and the channel supply layer, at least one channel depletion layer on the channel supply layer; a gate electrode on at least a part of the channel depletion layer, and at least one bridge connecting the channel depletion layer and the source electrode. The channel depletion layer is configured to form a depletion region in the 2DEG. The HEMT has a ratio of a first impedance to a second impedance that is a uniform value. The first impedance is between the gate electrode and the channel depletion layer. The second impedance is between the source electrode and the channel depletion layer.

18 Claims, 6 Drawing Sheets

(51) Int. Cl.
 *H01L 29/40* (2006.01)
 *H01L 29/417* (2006.01)
 *H01L 29/423* (2006.01)
 *H01L 29/20* (2006.01)

(52) U.S. Cl.
 CPC ...... *H01L 29/66462* (2013.01); *H01L 29/7787* (2013.01)

(56) References Cited

U.S. PATENT DOCUMENTS

| | | | |
|---|---|---|---|
| 7,161,194 B2 * | 1/2007 | Parikh et al. | 257/194 |
| 7,388,236 B2 * | 6/2008 | Wu et al. | 257/194 |
| 7,501,669 B2 * | 3/2009 | Parikh et al. | 257/194 |
| 7,550,783 B2 * | 6/2009 | Wu et al. | 257/194 |
| 7,576,373 B1 * | 8/2009 | Hikita et al. | 257/192 |
| 7,638,818 B2 * | 12/2009 | Wu et al. | 257/192 |
| 7,855,401 B2 * | 12/2010 | Sheppard et al. | 257/194 |
| 7,884,395 B2 * | 2/2011 | Saito | 257/199 |
| 7,898,004 B2 * | 3/2011 | Wu et al. | 257/194 |
| 8,586,997 B2 * | 11/2013 | Simin et al. | 257/77 |
| 8,772,834 B2 * | 7/2014 | Jeon et al. | 257/194 |
| 8,785,944 B2 * | 7/2014 | Hwang et al. | 257/76 |
| 8,816,396 B2 * | 8/2014 | Hwang et al. | 257/194 |
| 9,029,915 B2 * | 5/2015 | Saito et al. | 257/194 |
| 9,041,065 B2 * | 5/2015 | Wu et al. | 257/194 |
| 2003/0006437 A1 * | 1/2003 | Mizuta et al. | 257/283 |
| 2004/0061129 A1 * | 4/2004 | Saxler et al. | 257/192 |
| 2005/0189559 A1 * | 9/2005 | Saito et al. | 257/189 |
| 2005/0194612 A1 * | 9/2005 | Beach | 257/192 |
| 2005/0253168 A1 * | 11/2005 | Wu et al. | 257/192 |
| 2006/0011915 A1 * | 1/2006 | Saito et al. | 257/65 |
| 2006/0102929 A1 * | 5/2006 | Okamoto et al. | 257/189 |
| 2006/0202272 A1 * | 9/2006 | Wu et al. | 257/355 |
| 2007/0278521 A1 * | 12/2007 | Ishida et al. | 257/192 |
| 2010/0163928 A1 * | 7/2010 | Imada et al. | 257/194 |
| 2010/0264462 A1 * | 10/2010 | Hirler et al. | 257/194 |
| 2011/0210377 A1 | 9/2011 | Haeberlen et al. | |
| 2012/0267686 A1 * | 10/2012 | Jeon et al. | 257/194 |
| 2013/0062666 A1 * | 3/2013 | Imada | 257/194 |
| 2013/0099285 A1 * | 4/2013 | Hwang et al. | 257/194 |
| 2013/0146890 A1 | 6/2013 | Hwang et al. | |
| 2013/0240897 A1 * | 9/2013 | Imada | 257/76 |
| 2014/0021511 A1 * | 1/2014 | Jeon et al. | 257/194 |
| 2014/0035047 A1 * | 2/2014 | Korec et al. | 257/368 |
| 2014/0092638 A1 * | 4/2014 | Nishimori et al. | 363/17 |
| 2014/0138698 A1 * | 5/2014 | Lin | 257/76 |
| 2014/0151749 A1 * | 6/2014 | Jeon et al. | 257/194 |
| 2014/0175451 A1 * | 6/2014 | Bhalla et al. | 257/76 |
| 2014/0264441 A1 * | 9/2014 | Murase | 257/190 |
| 2014/0284701 A1 * | 9/2014 | Korec | 257/328 |
| 2014/0327043 A1 * | 11/2014 | Kim et al. | 257/190 |
| 2014/0363937 A1 * | 12/2014 | Chang et al. | 438/186 |
| 2015/0155273 A1 * | 6/2015 | Nakajima et al. | 257/76 |
| 2015/0179732 A1 * | 6/2015 | Marino et al. | 257/401 |

FOREIGN PATENT DOCUMENTS

| | | | | |
|---|---|---|---|---|
| JP | 2012009863 A | | 1/2012 | |
| KR | 10-2010-0034921 | * | 4/2010 | ........... H01L 29/744 |

OTHER PUBLICATIONS

I. Hwang et al., Source-Connected p-GaN Gate HEMTs for Increased Threshold Voltage, IEEE, IEEE Electron Device Letters, vol. 34, No. 5 (May 2013), pp. 605-607.*

X. Hu, "Enhancement Mode AlGaN/GaN HFET With Selectively Grown *pn* Junction Gate", Electronics Letters Apr. 13, 2000 vol. 36 No. 8, 2pg.

Y. Uemoto, "Gate Injection Transistor (GIT)—A Normally-Off ALGAN/GAN Power Transistor Using Conductivity Modulation", Digital Object Identifier 10.1109/TED.2007.908601, 7pg.

* cited by examiner

HIGH ELECTRON MOBILITY TRANSISTOR

RELATED APPLICATIONS

This application claims priority under 35 U.S.C. §119 to Korean Patent Application No. 10-2013-0124169, filed on Oct. 17, 2013, in the Korean Intellectual Property Office, the disclosure of which is incorporated herein in its entirety by reference.

BACKGROUND

1. Field

The present disclosure relates to a high electron mobility transistor, and/or more particularly to a high electron mobility transistor having a normally-off characteristic.

2. Description of Related Art

A nitride semiconductor device may be used as a power device for power control. In a power conversion system, an efficiency of the power device may affect the efficiency of the entire system. Examples of power devices include a metal-oxide-semiconductor field-effect transistor (MOSFET) or an insulated gate bipolar transistor (IGBT), which are based on silicon (Si). However, increasing the efficiency of Si-based power devices may be limited by Si properties and/or manufacturing processes. Other examples of power device include power devices using a III-V group-based compound semiconductor, such as a high electron mobility transistor (HEMT). The HEMT may include a heterojunction structure of a compound semiconductor.

HEMTs may include semiconductor layers having different electrical polarization characteristics, wherein one semiconductor layer having a relatively high polarizability may induce a 2-dimensional electron gas (2DEG) in the other semiconductor layer. Since the 2DEG may be used as a channel, the HEMT may have a high electron mobility. Also, HEMTs may include a compound semiconductor having a wide band gap. Thus, a breakdown voltage of the HEMT may be higher than that of a general transistor. The breakdown voltage of the HEMT may increase in proportion to a thickness of a compound semiconductor layer including 2DEG, for example, a gallium nitride (GaN) layer. Also, a normally-off function may be desired for a normal operation of the power device.

SUMMARY

Example embodiments relate to a high electron mobility transistor (HEMT) having a normally-off characteristic.

Additional aspects will be set forth in the description that follows and, in part, will be apparent from the description, or may be learned by practice of example embodiments.

According to example embodiments, a high electron mobility transistor (HEMT) includes: a channel layer having a 2-dimensional electron gas (2DEG); a channel supply layer on the channel layer; a source electrode and a drain electrode spaced apart from each other on one of the channel layer and the channel supply layer; a channel depletion layer on the channel supply layer, the channel depletion layer configured to form a depletion region in the 2DEG; a gate electrode on at least a part of the channel depletion layer; and at least one bridge connecting the channel depletion layer to the source electrode. The HEMT has a ratio of a first impedance to a second impedance that is a uniform value. The first impedance is between the gate electrode and the channel depletion layer. The second impedance is between the source electrode and the channel depletion layer.

In example embodiments, the ratio of the first impedance to the second impedance may be in a range from 0.1 to 10.

In example embodiments, the ratio of the first impedance to the second impedance may have the uniform value regardless of an operation frequency of the HEMT.

In example embodiments, the ratio of the first impedance to the second impedance may have the uniform value in an operation frequency of the HEMT in a range from 1 KHz to 1 GHz.

In example embodiments, the first impedance may include a first conductance (GG) between the gate electrode and the channel depletion layer, a first capacitance (CG) between the gate electrode and the channel depletion layer, and a first resistance (RG) between the gate electrode and the channel depletion layer. The second impedance may include a second conductance (GS) between the source electrode and the channel depletion layer, a second capacitance (CS) between the source electrode and the channel depletion layer, and a second resistance (RS) between the source electrode and the channel depletion layer. An equation GS/GG=CS/CG=RG/RS may be satisfied.

In example embodiments, a first contact may connect the gate electrode to the channel depletion layer, and a second contact and the at least one bridge may connect the source electrode to the channel depletion layer.

In example embodiments, the first and second contacts may include a metal.

In example embodiments, the first and second contacts may include one of a semiconductor and an insulator.

In example embodiments, the channel depletion layer may include a first channel depletion layer and a second channel depletion layer spaced apart from each other, a third channel depletion layer between the first and second channel depletion layers, and a fourth channel depletion layer protruding from the first channel depletion layer.

In example embodiments, the first contact may protrude above the third channel depletion layer from the gate electrode.

In example embodiments, the second contact may be on the fourth channel depletion layer.

In example embodiments, the ratio of the first impedance to the second impedance may be determined by a ratio of a contact area between the first contact and the third channel depletion layer to a contact area between the second contact and the fourth channel depletion layer.

According to example embodiments, a high electron mobility transistor (HEMT) includes: a channel layer; a channel supply layer on the channel layer, the channel supply layer configured to form a 2-dimensional gas (2DEG) in the channel layer; a source electrode and a drain electrode spaced apart from each other on one of the channel layer and the channel supply layer; a channel depletion layer on the channel supply layer between the source and drain electrodes, the channel depletion layer configured to form a depletion region in the 2DEG; a gate electrode on the channel depletion layer, the gate electrode electrically connected to the channel depletion layer through a first contact area; and at least one bridge over the channel depletion layer. The at least one bridge connects the channel depletion layer to the source electrode through a second contact area. The first and second contact areas correspond to different parts of the channel depletion layer.

In example embodiments, a ratio of a first impedance to a second impedance may be a uniform value. The first impedance may be between the gate electrode and the channel depletion layer. The second impedance may be between the source electrode and the channel depletion layer.

In example embodiments, the ratio of the first impedance to the second impedance may be in a range from 0.1 to 10, and the ratio of the first impedance to the second impedance may have a uniform value in an operation frequency of the HEMT in a range of 1 KHz to 1 GHz.

In example embodiments, a first contact may be on the channel depletion layer, and a second contact may be on the channel depletion layer. The first contact and the second contact may be spaced apart from each other. The gate electrode may be electrically connected to the channel depletion layer through the first contact. The at least one bridge may include one bridge that is electrically connected to the channel depletion layer through the second contact.

In example embodiments, the gate electrode may be on the first contact, and the one bridge may be on the second contact.

According to example embodiments, an array structure may include a substrate, and a plurality of the foregoing HEMTs may be on the substrate.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating features of example embodiments. In the drawings.

DETAILED DESCRIPTION

Figure 1:
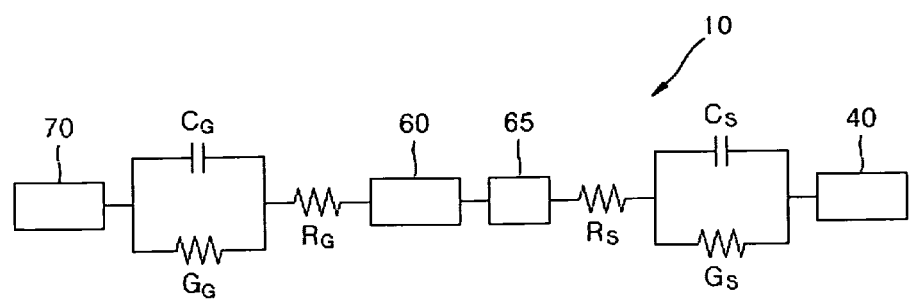
FIG. 1 is an equivalent circuit diagram between a gate electrode and a source electrode of a high electron mobility transistor (HEMT), according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an equivalent circuit diagram of a high electron mobility transistor (HEMT) 10, according to example embodiments.

The HEMT 10 may include a source electrode 40 and a gate electrode 70. Also, a channel depletion layer 60 may be disposed between the source electrode 40 and the gate electrode 70. A bridge 65 may be further disposed between the source electrode 40 and the channel depletion layer 60.

A threshold voltage may increase due to the channel depletion layer 60 and the bridge 65. However, for example, the threshold voltage may decrease under a threshold voltage measurement using a pulse lower than or equal to 1 μs. According to an increase in an operation frequency of the transistor, an impedance of a barrier may decrease; thus, a weight occupied by resistance between the channel depletion layer 60 and the bridge 65 may increase in entire impedance, thereby decreasing a threshold voltage increase effect by the bridge 65.

A threshold voltage $V_T$ may be obtained according to Equation 1 below. The threshold voltage $V_T$ denotes a minimum voltage for setting a channel layer below the gate electrode 70 to be in an on-state.

$$V_T = V_{TO}(1 + Z_G/Z_S) \quad \text{[Equation 1]}$$

Here, $V_{TO}$ denotes a threshold voltage when a bridge is not present. Also, $Z_G$ denotes impedance between the gate electrode 70 and the channel depletion layer 60, and $Z_S$ denotes impedance between the source electrode 40 and the channel depletion layer 60. Hereinafter, $Z_S$ will be referred to as source impedance and $Z_G$ will be referred to as gate impedance. $Z_G$ and $Z_S$ may be respectively obtained according to Equations 2 and 3 below.

$$Z_G = (G_G + i\overline{\omega} C_G)^{-1} + R_G \quad \text{[Equation 2]}$$

$$Z_S = (G_S + i\overline{\omega} C_D)^{-1} + R_S \quad \text{[Equation 3]}$$

Here, $G_G$ denotes conductance between the gate electrode 70 and the channel depletion layer 60, $C_G$ denotes capacitance between the gate electrode 70 and the channel depletion layer 60, $R_G$ denotes resistance between the gate electrode 70 and the channel depletion layer 60, $G_S$ denotes conductance between the source electrode 40 and the channel depletion layer 60, $C_S$ denotes capacitance between the source electrode 40 and the channel depletion layer 60, and $R_S$ denotes resistance between the source electrode 40 and the channel depletion layer 60. Also, ω denotes an operation frequency of the transistor.

According to Equations 1 and 2, since $Z_G$ and $Z_S$ are functions of the operation frequency ω, a threshold voltage of the transistor may change according to the operation frequency ω. Accordingly, even when the channel depletion layer 60 and the bridge 65 are used to increase a threshold voltage, the threshold voltage may decrease according to a change in an operation frequency.

However, according to Equation 1, the threshold voltage $V_T$ may be uniformly maintained regardless of an operation frequency of an HEMT when a ratio ($Z_G/Z_S$) of the gate impedance $Z_G$ and the source impedance $Z_S$ is uniform. In other words, a high threshold voltage may be uniformly maintained, even when an operation frequency changes, by matching gate impedance and source impedance.

A method of uniformly maintaining a ratio of gate impedance to source impedance regardless of an operation frequency may vary.

According to Equations 2 and 3, $Z_G/Z_S$ may have a constant value a when $G_G$, $G_S$, $C_G$, $C_S$, $R_G$, and $R_S$ satisfy Equations 4 through 6 below.

$$G_G = G_S/\alpha \quad \text{[Equation 4]}$$

$$C_G = C_S/\alpha \quad \text{[Equation 5]}$$

$$R_G = R_S \times \alpha \quad \text{[Equation 6]}$$

In other words, when $G_S/G_G = C_S/C_G = R_G/R_S = \alpha$, $Z_G/Z_S$ may have a uniform value. $C_G$ and $G_G$ are proportional to a contact area between the gate electrode 70 and the channel depletion layer 60, and $C_S$ and $G_S$ are proportional to a contact area between the source electrode 40 (or the bridge 65) and the channel depletion layer 60. Also, $R_G$ is inversely proportional to the contact area between the gate electrode 70 and the channel depletion layer 60, and $R_S$ is inversely proportional to the contact area between the source electrode 40 (or the bridge 65) and the channel depletion layer 60.

Accordingly, a threshold voltage may be controlled according to the contact area between the gate electrode 70 and the channel depletion layer 60, and the contact area between the source electrode 40 (or the bridge 65) and the channel depletion layer 60. In other words, a ratio of gate impedance to source impedance may be adjusted by a ratio of a contact area $A_G$ between a gate electrode and a channel depletion layer to a contact area $A_S$ between a source electrode (or a bridge) and the channel depletion layer. Since impedance is inversely proportional to a contact area, the ratio of the gate impedance to the source impedance may be adjusted by the ratio of the contact area $A_S$ to the contact area $A_G$.

Figure 2:
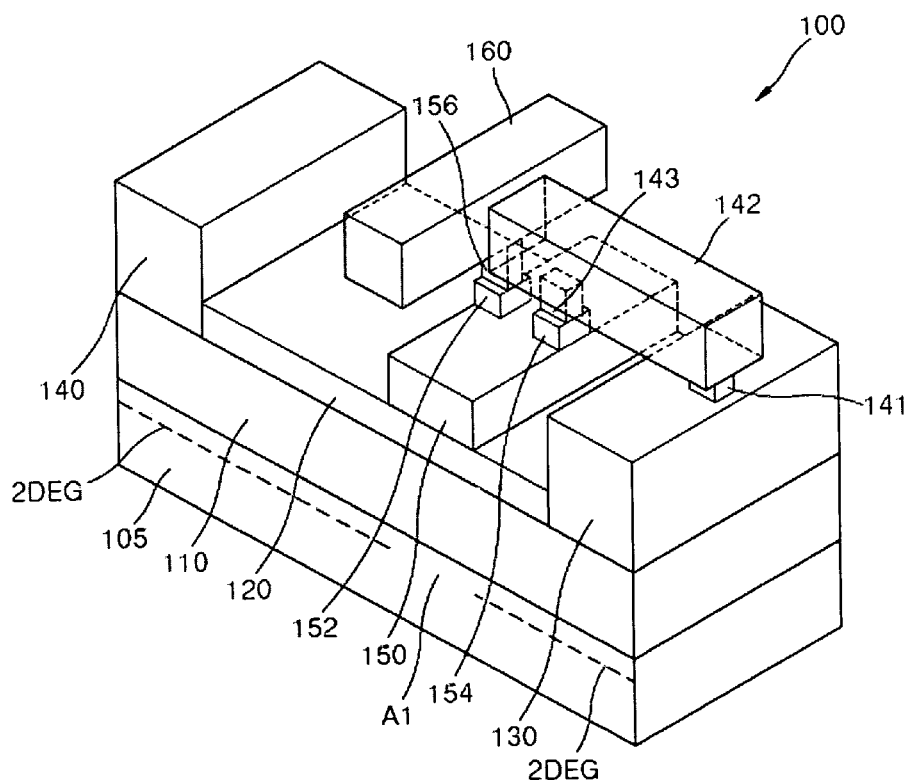
FIG. 2 is a perspective view of an HEMT according to example embodiments.

FIG. 2 is a perspective view of an HEMT 100 according to example embodiments. The HEMT 100 includes a channel layer 110 including a 2-dimensional electron gas (2DEG), a channel supply layer 120 on the channel layer 110, a source electrode 130 and a drain electrode 140 spaced apart from each other on the channel layer 110 or channel supply layer 120, and at least one channel depletion layer 150 on the channel supply layer 120. The channel depletion layer 150 forms a depletion region in the 2DEG. In FIG. 2, the source and drain electrodes 130 and 140 are disposed on the channel layer 110, but may alternatively be disposed on the channel supply layer 120.

A gate electrode 160 is combined to at least a part of the channel depletion layer 150, and at least one bridge 142 may connect the at least one channel depletion layer 150 and the source electrode 130. Here, the bridge 142 may be formed of a metal.

A first contact 152 may be disposed between the channel depletion layer 150 and the gate electrode 160, and a second contact 154 may be disposed between the channel depletion layer 150 and the bridge 142. The first and second contacts 152 and 154 may be formed of a metal. The first and second contacts 152 and 154 may be disposed on an upper surface of the channel depletion layer 150. The bridge 142 may be connected to the upper surface of the source electrode 130 from the second contact 154. In FIG. 2, the gate electrode 160 and the at least one bridge 142 may be electrically connected to each other through the first contact 152, the second contact 154, and the channel depletion layer 150.

The gate electrode 160 may be combined to the first contact 152 directly or via another connector. The bridge 142 may be combined to the second contact 154 directly or via another connector.

A first post 156 may be further disposed between the first contact 152 and the gate electrode 160. A second post 143 may be further disposed between the second contact 154 and the bridge 142. Also, a third post 141 may be further disposed between the source electrode 130 and the bridge 142. The first, second, and third posts 156, 143, and 141 may be formed to match heights of the gate electrode 160 and bridge 142. The first, second, and third posts 156, 143, and 141 may be formed of the same metal as the bridge 142.

By using a metal to form the first contact 152, resistance between the gate electrode 160 and the channel depletion layer 150 may be very small. By using a metal to form the first contact 152, resistance between the bridge 142 and the channel depletion layer 150 or between the source electrode 130 and the channel depletion layer 150 may be very small.

Since $R_G$ and $R_S$ are relatively very small compared to $G_G$, $C_G$, $G_S$, and $C_S$ in Equations 2 and 3. $R_G$ and $R_S$ may be ignored.

Thus, Equations 2 and 3 may be summarized as Equations 7 and 8 below.

$$Z_G \approx (G_G + i\overline{\omega} C_G)^{-1} \quad \text{[Equation 7]}$$

$$Z_S \approx (G_S + i\overline{\omega} C_S)^{-1} \quad \text{[Equation 8]}$$

According to Equations 7 and 8, when $G_G$, $C_G$, $G_S$, and $C_S$ satisfy Equations 4 and 5, $Z_G/Z_S$ may have a uniform value regardless of the operation frequency $\omega$. In other words, when $G_S/G_G = C_S/C_G = \alpha$, $Z_G/Z_S$ may have a uniform value.

$C_G$ and $G_G$ are proportional to a contact area between a gate electrode and a channel depletion layer, and $C_S$ and $G_S$ are proportional to a contact area between a source electrode (or a bridge) and the channel depletion layer. In the HEMT 100 of FIG. 2, $Z_G/Z_S$ may be determined by a contact area between the first contact 152 and the channel depletion layer 150 and a contact area between the second contact 154 and the channel depletion layer 150.

When $A_G$ denotes the contact area between the first contact 152 and the channel depletion layer 150 and $A_S$ denotes the contact area between the second contact 154 and the channel depletion layer 150, $A_G/A_S$ may be set to be equal to $\alpha$ (wherein $\alpha$ is a constant) so that a ratio of first impedance to second impedance is uniformly maintained regardless of an operation frequency. For example, $A_G/A_S$ may be 2 or 3, or in a range from 2 to 3, but example embodiments are not limited thereto. Thus, the ratio of the first impedance between the gate electrode 160 and the channel depletion layer 150 to the second impedance between the source electrode 140 and the channel depletion layer 150 may have a uniform value. For example, the ratio of the first impedance to the second impedance may be in a range from 0.1 to 10.

Meanwhile, by uniformly maintaining the ratio of the first impedance to the second impedance such that the ratio is independent from the operation frequency, a threshold voltage may be increased and such an increased threshold voltage may be maintained. The HEMT 100 may have a satisfactory normally-off characteristic according to the increased threshold voltage that is maintained to be independent from the operation frequency.

Also, the ratio of the first impedance to the second impedance may have a uniform value within an effective range of the operation frequency. The effective range may denote an available range. Changing the structure of an HEMT may be restricted if a ratio of first impedance to second impedance must be kept to a constant value. Accordingly, the degree of freedom of changing a structure of an HEMT may be expanded as long as the ratio of first impedance to second impedance is within the available range. For example, the ratio of the first impedance to the second impedance may have a uniform value within an operation frequency range of 1 KHz to 1 GHz.

A substrate 105 may be disposed below the channel layer 110. The substrate 105 may include, for example, sapphire, silicon (Si), silicon carbide (SIC), or gallium nitride (GaN). However, a material included in the substrate 105 is not limited thereto and may vary. The channel layer 110 may include a first semiconductor material. Here, as an example, the first semiconductor material may be a III-V group-based compound semiconductor material, but is not limited thereto. For example, the channel layer 110 may be a GaN-based material layer. Alternatively, the channel layer 110 may be a GaN layer, indium gallium nitride (InGaN) layer, or an aluminum gallium nitride (AlGaN) layer. The channel layer 110 may be an undoped or n-doped layer. However, the channel layer 110 is not limited thereto, and may be a material layer different from a semiconductor layer as long as it is formed of a material capable of forming a 2DEG. In the channel layer 110, for example, a 2DEG layer may be formed according to spontaneous polarization $P_{SP}$ and piezo polarization $P_{PE}$ due to tensile strain.

For example, the channel layer 110 may be a GaN layer. In this case, the channel layer 110 may be an undoped GaN layer, or a predetermined impurity-doped GaN layer. Since a GaN-based semiconductor may have excellent properties, such as a high energy bandgap, high thermal and chemical stability, and high electron saturation speed (e.g., up to $3 \times 10^7$ cm/sec), the GaN-based semiconductor may be used not only for an optical device but also for an electronic device for high frequency and high output. The electronic device using the GaN-based semiconductor may have various characteristics, such as a high breakdown electric field (e.g., up to $3 \times 10^6$ V/cm), high maximum current density, a stable high temperature operation characteristic, and high thermal conductivity. When an HEMT uses a GaN-based heterojunction structure, band-discontinuity between a channel layer and a channel supply layer may be high. Thus, electron mobility may be increased since electrons may be concentrated at a high concentration on a bonded interface.

The channel supply layer 120 may induce a 2DEG in the channel layer 110. Here, the 2DEG may be formed in the channel layer 110 below an interface of the channel layer 110 and the channel supply layer 120. The channel supply layer 120 may include a second semiconductor material different from the first semiconductor material forming the channel layer 110. The second semiconductor material may be different from the first semiconductor material in at least one of a polarization characteristic, an energy bandgap, and a lattice constant. For example, at least one of polarizability and an energy bandgap of the second semiconductor material may be higher than at least one thereof of the first semiconductor material.

The channel supply layer 120 may include a nitride including at least one of Al, Ga, and In, and may have a single layer or multi-layer structure. For example, the channel supply layer 120 may be any one of an AlN layer, an AlGaN layer, an AlInN layer, an AlGaInN layer, or a combination layer thereof, but is not limited thereto. The channel supply layer 120 may be an undoped layer or an impurity-doped layer. A thickness of the channel supply layer 120 may be, for example, lower than or equal to dozens of nm. For example, the thickness of the channel supply layer 120 may be lower than or equal to about 50 nm, but is not limited thereto.

The source electrode 130 and the drain electrode 140 may be electrically connected to the 2DEG. The 2DEG formed in the channel layer 110 may be used as a current path (channel) between the source electrode 130 and the drain electrode 140.

The channel depletion layer 150 may form a depletion region A1 in the 2DEG. Accordingly, conduction band energy and valence band of the channel supply layer 120 disposed below the channel depletion layer 150 may increase, and thus the depletion region A1 of the 2DEG may be formed in a region of the channel layer 110 corresponding to the channel depletion layer 150. Thus, the 2DEG may be blocked or reduced in the region of the channel layer 110 corresponding to the channel depletion layer 150. Alternatively, the region of the channel layer 110 corresponding to the channel depletion layer 150 may have characteristics, such as electron concentration, different from other regions of the channel layer 110. A region where the 2DEG is blocked may be referred to as a 'blocked region', and the HEMT 110 may have a normally-off characteristic due to the blocked region.

The channel depletion layer 150 may include a p-type semiconductor material. In other words, the channel depletion layer 150 may be a p-type impurity-doped semiconductor layer. Alternatively, the channel depletion layer 150 may include a III-V group-based nitride semiconductor. For example, the channel depletion layer 150 may include at least one of GaN, AlGaN, InN, AlInN, InGaN, and AlInGaN, or may be doped by a p-type impurity, such as Mg. For example, the channel depletion layer 150 may be a p-GaN layer or a p-AlGaN layer.

The gate electrode 160 may be formed of a conductive material. The gate electrode 160 may be formed of a metal, a metal alloy, conductive metal oxide, or conductive metal nitride. For example, the gate electrode 160 may be formed of a material including at least one of hafnium (Hf), tantalum (Ta), tungsten (W), titanium (Ti), and Al. For example, the gate electrode 160 may be formed of $TiAl_3$. Alternatively, the gate electrode 160 may be formed of transition metal nitride, such as TiN, TaN, or WN. Alternatively, the gate electrode 160 may be formed of an n-type impurity-doped semiconductor material, such as n-type Si or n-type germanium (Ge).

The at least one bridge 142 may be disposed between the channel depletion layer 150 and the source electrode 130. The bridge 142 may be formed of the same material as the channel depletion layer 150. For example, the bridge 142 may include a p-type semiconductor material. The bridge 142 may include a III-V group-based nitride semiconductor. For example, the bridge 142 may include at least one of GaN, AlGaN, InN, AlInN, InGaN, and AlInGaN, or may be doped by a p-type impurity, such as Mg. For example, the bridge 142 may be a p-GaN layer or p-AlGaN layer.

Impedance of the HEMT 100 of FIG. 2 may be as follows. For example, impedance of the first contact 152 may be represented by a series connection between the resistance of the first contact 152 and a parallel connection of capacitance and conductance generated as the first contact 152 contacts the channel depletion layer 150. The resistance of the first contact 152 may be obtained according to (resistivity*thickness/sectional area). Impedance in the second contact 154 may be represented by a series connection between the resistance of the second contact 154 and parallel connection of capacitance and conductance generated as the second contact 154 contacts the channel depletion layer 150.

While a case where the first and the second contacts 152 and 154 include a metal has been described, example embodiments are not limited thereto. The first and second contacts 152 and 154 may alternatively include one of a semiconductor and an insulator. A material of the first contact 152 may be the same as or different than a material of the second contact 154.

Figure 3:
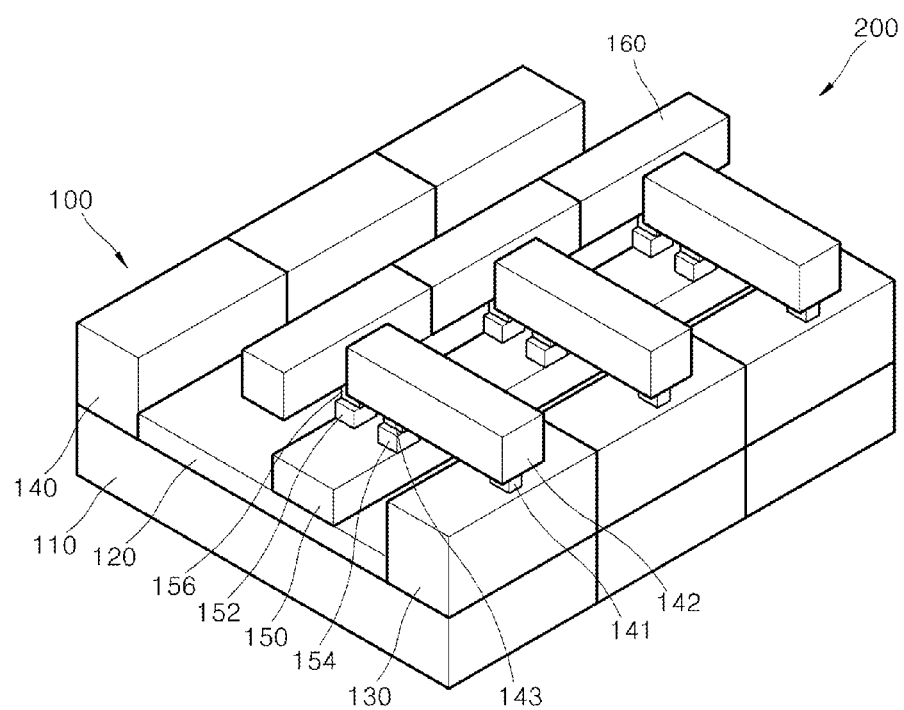
FIG. 3 is a view of an array structure of the HEMT of FIG. 2.

FIG. 3 is a view of an array structure 200 of the HEMT 100 of FIG. 2. A plurality of HEMTs 100 of FIG. 2 may be arranged in the array structure 200. The array structure 200 may be applied to an electronic device that is large in size.

Since the HEMT 100 has been described above with reference to FIG. 2, details thereof will not be repeated here.

Figure 4:
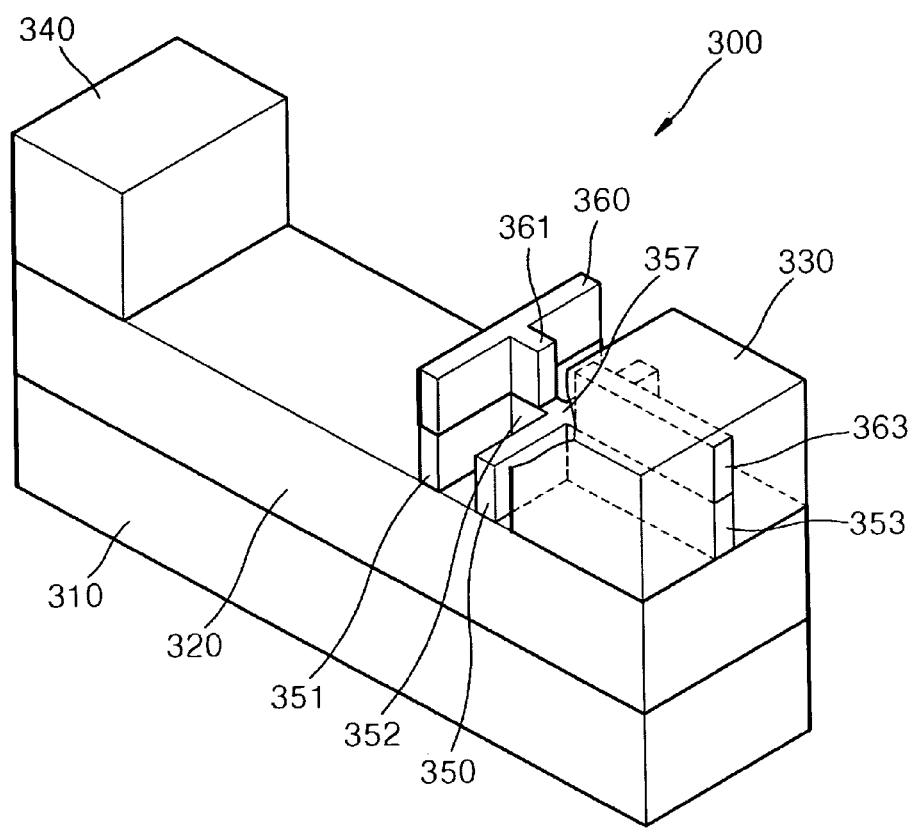
FIG. 4 is a perspective view of an HEMT according to example embodiments.
Figure 5:
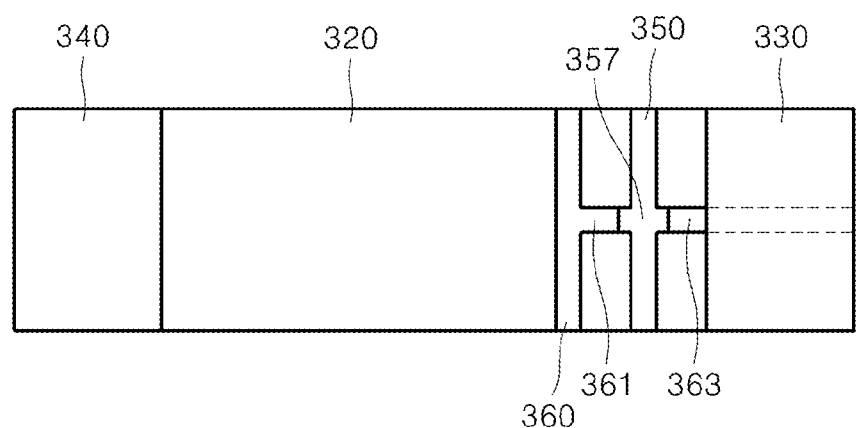
FIG. 5 is a plan view of the HEMT of FIG. 4.

FIG. 4 is a perspective view of an HEMT 300 according to example embodiments, FIG. 5 is a plan view of the HEMT 300 of FIG. 4.

The HEMT 300 includes a channel supply layer 320, and a source electrode 330 and drain electrode 340 spaced apart from each other on the channel supply layer 320. A channel layer 310 may be further disposed below the channel supply layer 320. Although not shown in FIGS. 4-5, the channel layer 310 may be on a substrate (e.g., sapphire, Si, SiC, or GaN substrate). At least one channel depletion layer may be disposed between the source electrode 330 and the drain electrode 340. The at least one channel depletion layer includes a first channel depletion layer 350 and a second channel depletion layer 351, which are spaced apart from each other. A third channel depletion layer 352 is disposed between the first and second channel depletion layers 350 and 351, and a fourth channel depletion layer 353 may protrude and extend from the first channel depletion layer 350. A gate electrode 360 is disposed on the second channel depletion layer 351. A first contact (or a gate contact) 361 extends and protrudes from the gate electrode 360. The first contact 361 may extend to a partial region of the third channel depletion layer 352. A second contact (or a source contact) 363 may be disposed on the fourth channel depletion layer 353. Also, a bridge 357 may be disposed in a region where the first contact 361 and the second contact 363 do not contact each other between the third and fourth channel depletion layers 352 and 353.

For example, a ratio of first impedance (or gate impedance) between the gate electrode 360 and the first channel depletion layer 350 to second impedance (or source impedance) between the source electrode 330 and the fourth channel depletion layer 353 may have a uniform value when a ratio of a contact area between the third channel depletion layer 352 and the first contact 361 to a contact area between the fourth channel depletion layer 353 and the second contact 363 has a uniform value. For example, the ratio of the first impedance to the second impedance may be in a range from 0.1 to 10, and may be adjusted by adjusting the ratio of the contact area between the third channel depletion layer 352 and the first contact 361 to the contact area between the fourth channel depletion layer 353 and the second contact 363.

In the HEMT 300, the channel layer 310, channel supply layer 320, source electrode 330, drain electrode 340, bridge 357, and gate electrode 360, respectively, may be formed of the same materials as the channel layer 110, channel supply layer 120, source electrode 130, drain electrode 140, bridge 142, and gate electrode 160, respectively, described previously with respect to FIGS. 2-3. In the HEMT 300, the first, second, third, and fourth channel depletion layers 350-353 may be formed of the same material as the channel depletion layer 150 described previously with respect to FIGS. 2-3. In the HEMT 300, the first and second contacts 361 and 363 may be formed of the same materials as the first and the second contacts 152 and 154 described previously with respect to FIGS. 2-3.

In FIG. 5, the bridge 357 may represent an intersection area of the first channel depletion layer 350, the third channel depletion layer 352, and the fourth channel depletion layer 353.

Figure 6:
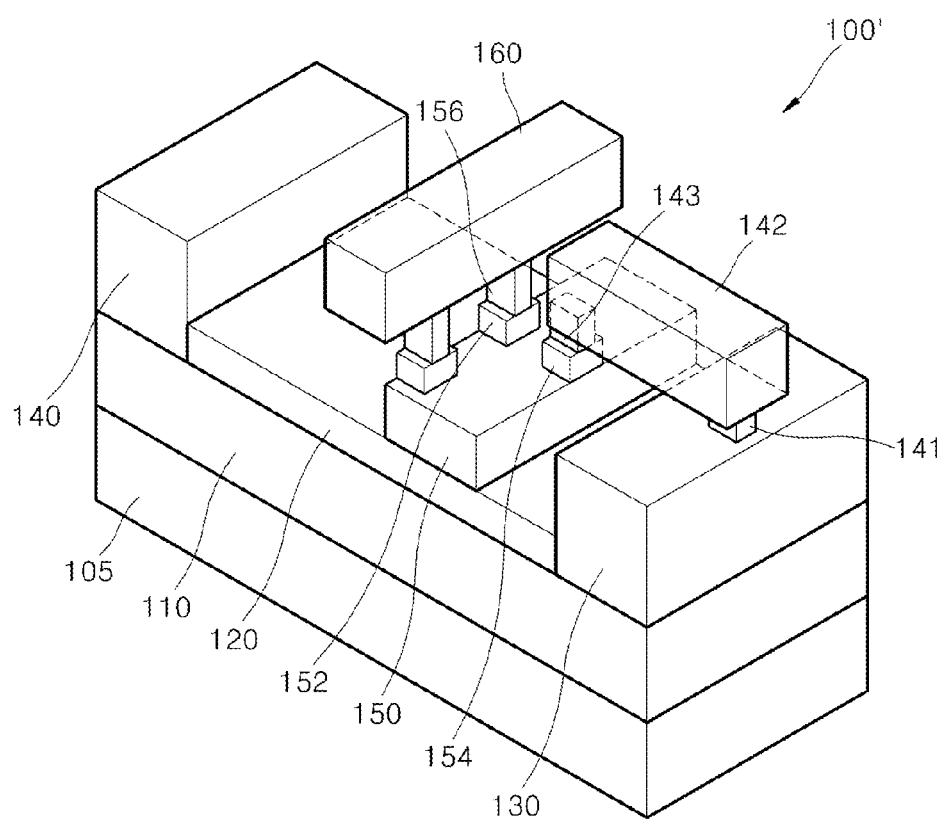
FIG. 6 is a perspective view of an HEMT according to example embodiments.

FIG. 6 is a perspective view of an HEMT according to example embodiments.

Referring to FIG. 6, a HEMT 100' according to example embodiments may be the same as the HEMT 100 described in FIG. 1, except the gate electrode 160 may be connected to the channel depletion layer 150 through a plurality of a third posts 156 and first contacts 152. Although, FIG. 6 illustrates two pairs of third posts 156 and first contacts 152, example embodiments are not limited thereto. The number of pairs of third posts 156 and first contacts 152 may be an integer greater than 2.

Figure 7:
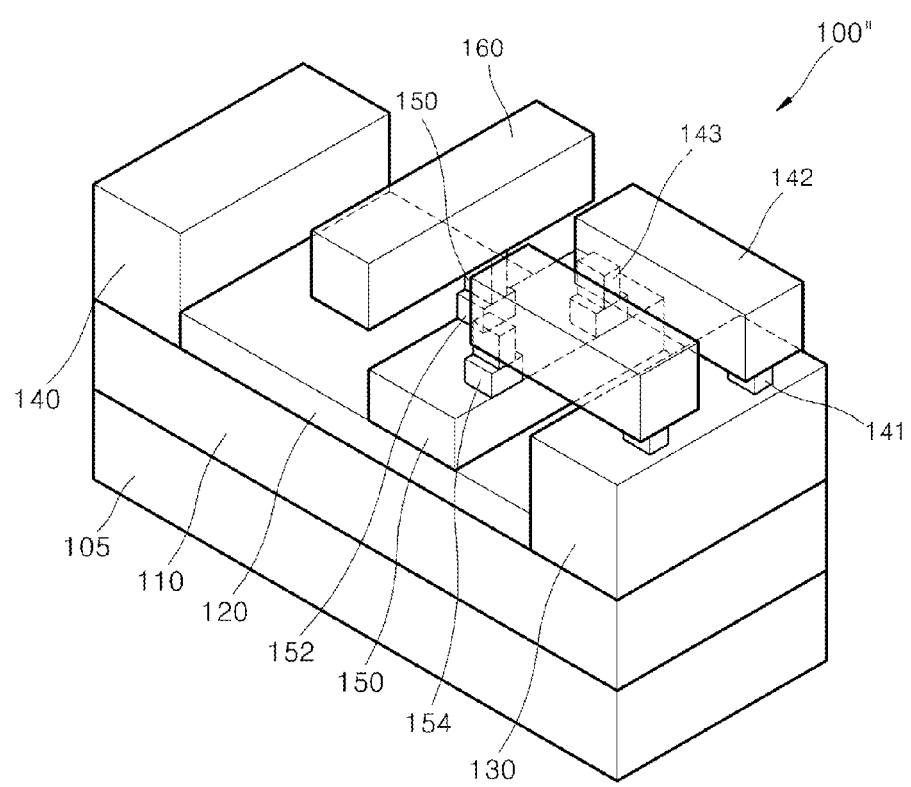
FIG. 7 is a perspective view of an HEMT according to example embodiments.

FIG. 7 is a perspective view of an HEMT according to example embodiments.

Referring to FIG. 7, a HEMT 100" according to example embodiments may be the same as the HEMT 100 described in FIG. 1, except FIG. 7 illustrates the source electrode 130 may be connected to the channel depletion layer 150 through a plurality of bridges 142.

As described above, in HEMTs according to example embodiments, by setting a ratio of gate impedance to source impedance to have a uniform value, a threshold voltage of a transistor may be more uniformly maintained regardless of an operation frequency of the transistor.

While some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
a channel layer having a 2-dimensional electron gas (2DEG);
a channel supply layer on the channel layer;
a source electrode and a drain electrode spaced apart from each other on one of the channel layer and the channel supply layer;
a channel depletion layer on the channel supply layer, the channel depletion layer configured to form a depletion region in the 2DEG;
a gate electrode on at least a part of the channel depletion layer; and
at least one bridge connecting the channel depletion layer to the source electrode, the HEMT having a ratio of a first impedance to a second impedance being a uniform value, the first impedance being between the gate electrode and the channel depletion layer, the second impedance being between the source electrode and the channel depletion layer.

2. The HEMT of claim 1, wherein the ratio of the first impedance to the second impedance is in a range from 0.1 to 10.

3. The HEMT of claim 1, wherein the ratio of the first impedance to the second impedance has the uniform value regardless of an operation frequency of the HEMT.

4. The HEMT of claim 1, wherein the ratio of the first impedance to the second impedance has the uniform value in an operation frequency of the HEMT in a range from 1 KHz to 1 GHz.

5. The HEMT of claim 1, wherein
the first impedance includes a first conductance (GG) between the gate electrode and the channel depletion layer, a first capacitance (CG) between the gate electrode and the channel depletion layer, and a first resistance (RG) between the gate electrode and the channel depletion layer, and
the second impedance includes a second conductance (GS) between the source electrode and the channel depletion layer, a second capacitance (CS) between the source electrode and the channel depletion layer, and a second resistance (RS) between the source electrode and the channel depletion layer, and
an equation GS/GG=CS/CG=RG/RS is satisfied.

6. The HEMT of claim 1, further comprising:
a first contact connecting the gate electrode to the channel depletion layer; and
a second contact, wherein
the second contact and the at least one bridge connect the source electrode to the channel depletion layer.

7. The HEMT of claim 6, wherein the first and second contacts include a metal.

8. The HEMT of claim 6, wherein the first and second contacts include one of a semiconductor and an insulator.

9. The HEMT of claim 6, wherein the channel depletion layer includes:
a first channel depletion layer and a second channel depletion layer spaced apart from each other,
a third channel depletion layer between the first and second channel depletion layers, and
a fourth channel depletion layer protruding from the first channel depletion layer.

10. The HEMT of claim 9, wherein the first contact protrudes above the third channel depletion layer from the gate electrode.

11. The HEMT of claim 10, wherein the second contact is on the fourth channel depletion layer.

12. The HEMT of claim 11, wherein the ratio of the first impedance to the second impedance is determined by a ratio of a contact area between the first contact and the third channel depletion layer to a contact area between the second contact and the fourth channel depletion layer.

13. A high electron mobility transistor (HEMT) comprising:
a channel layer,
a channel supply layer on the channel layer, the channel supply layer configured to form a 2-dimensional electron gas (2DEG) in the channel layer;
a source electrode and a drain electrode spaced apart from each other on one of the channel layer and the channel supply layer;
a channel depletion layer on the channel supply layer between the source and drain electrodes, the channel depletion layer configured to form a depletion region in the 2DEG;
a gate electrode on the channel depletion layer, the gate electrode electrically connected to the channel depletion layer through a first contact area; and
at least one bridge over the channel depletion layer, the at least one bridge connecting the channel depletion layer to the source electrode through a second contact area, the first and second contact areas corresponding to different parts of the channel depletion layer.

14. The HEMT of claim 13, wherein
a ratio of a first impedance to a second impedance being a uniform value,
the first impedance is between the gate electrode and the channel depletion layer, and
the second impedance is between the source electrode and the channel depletion layer.

15. The HEMT of claim 14, wherein
the ratio of the first impedance to the second impedance is in a range from 0.1 to 10, and
the ratio of the first impedance to the second impedance has a uniform value in an operation frequency of the HEMT in a range from 1 KHz to 1 GHz.

16. The HEMT of claim 13, further comprising:
a first contact on the channel depletion layer; and
a second contact on the channel depletion layer, wherein
the first contact and the second contact are spaced apart from each other,
the gate electrode is electrically connected to the channel depletion layer through the first contact, and the at least one bridge includes one bridge that is electrically connected to the channel depletion layer through the second contact.

17. The HEMT of claim 16, wherein
the gate electrode is on the first contact, and
the one bridge is on the second contact.

18. An array structure comprising:
a substrate;
a plurality of the HEMT of claim 13 on the substrate.

* * * * *